United States Patent [19]

Kato et al.

[11] Patent Number: 5,475,258

[45] Date of Patent: Dec. 12, 1995

[54] POWER SEMICONDUCTOR DEVICE WITH PROTECTIVE ELEMENT

[75] Inventors: Naohito Kato; Etsuji Toyoda, both of Kariya; Naoto Okabe, Chita, all of Japan

[73] Assignee: Nippondenso Co., Ltd., Kariya, Japan

[21] Appl. No.: 405,410

[22] Filed: Mar. 15, 1995

Related U.S. Application Data

[63] Continuation of Ser. No. 142,993, Oct. 29, 1993, abandoned.

[30] Foreign Application Priority Data

Oct. 30, 1992 [JP] Japan .................................. 4-292501
Sep. 10, 1993 [JP] Japan .................................. 5-225565

[51] Int. Cl.$^6$ ........................ H01L 29/161; H01L 29/20; H01L 29/22
[52] U.S. Cl. ............................................ 257/603; 257/630
[58] Field of Search ...................................... 257/603, 630

[56] References Cited

U.S. PATENT DOCUMENTS

| | | | |
|---|---|---|---|
| 4,437,107 | 3/1984 | Tensson et al. | 257/603 |
| 4,707,719 | 11/1987 | Whight . | |
| 4,896,199 | 1/1990 | Tsuzuki et al. . | |
| 4,990,976 | 2/1991 | Hattori | 257/603 |
| 5,204,988 | 4/1993 | Sakurai . | |

FOREIGN PATENT DOCUMENTS

| | | | |
|---|---|---|---|
| 060635 | 9/1982 | European Pat. Off. . | |
| 083699 | 9/1984 | European Pat. Off. . | |
| 0190423 | 8/1986 | European Pat. Off. . | |
| 190423 | 8/1986 | European Pat. Off. . | |
| 372820 | 6/1990 | European Pat. Off. . | |
| 0372820 | 6/1990 | European Pat. Off. | 257/603 |
| 566179 | 10/1993 | European Pat. Off. . | |
| 4123021 | 1/1992 | Germany . | |
| 55-52271 | 4/1980 | Japan | 257/603 |
| 61-129867 | 6/1986 | Japan . | |
| 61-129868 | 6/1986 | Japan . | |
| 2184074 | 7/1990 | Japan . | |
| 3283470 | 12/1991 | Japan | 257/603 |
| 2103877 | 2/1983 | United Kingdom . | |

OTHER PUBLICATIONS

Atwood et al, 'High Breakdown Voltage Device'; *IBM Tech Discl*, vol. 17, No. 8, 1975 Jan., p. 2333.
Patent Abstract of Japan vol. 14 No. 328 (E0952) Apr. 1990 re JP-A 2110976.
I. Yoshida et al, "Novel Gate-Protection Devices for MOSFET's", Japanese Journal of Appl. Science, (1983) pp. 81-84.

*Primary Examiner*—Ngân V. Ngô
*Assistant Examiner*—Stephen D. Meier

[57] ABSTRACT

A semiconductor device has a protective Zener diode formed through an insulation film to a silicon substrate having a power MOSFET formed thereon. The breakdown strength of the insulation film is substantially improved and the withstand voltage of the Zener diode can be set to a high value. A gate plate 11 electrically connected to an outer circumferential part of a p-type diffusion region 104 is installed, and element parts 112a– 112c and equipotential plates 113a–133c constituting a Zener diode group 115 are formed. The equipotential plates 113a–133c hold a prescribed potential by Zener diode pairs 114 of the element parts 112a–112c.

17 Claims, 13 Drawing Sheets

5,475,258

POWER SEMICONDUCTOR DEVICE WITH PROTECTIVE ELEMENT

This is a continuation of application Ser. No. 08/142,993, filed on Oct. 29, 1993, now abandoned.

BACKGROUND OF THE INVENTION

1. Field of the Invention

The present invention relates to a semiconductor device where a first semiconductor element formed on a main surface of a semiconductor substrate and a second semiconductor element formed on an insulation film covering the main surface are multiplied.

2. Description of the Related Art

As such a semiconductor device, for example, when an inductive load is driven by a power semiconductor element such as a power MOSFET, in order to prevent the possibility that the power semiconductor element is subjected to application of overvoltage due to flyback of the load and is broken, in some embodiments, a protective element is installed integral with the power semiconductor element.

That is, in the case of an embodiment where an inductive load is driven by connecting a power MOSFET for example at low potential side, when the power MOSFET is turned off, flyback voltage is generated at the load and its positive voltage is applied to the power MOSFET. Then in some cases, the positive voltage may exceed the withstand voltage of the power MOSFET resulting in breakage of the element.

Therefore in order to prevent an element from being broken due to such overvoltage, for example, in a power MOSFET, a Zener diode is connected between drain and gate, when a definite voltage or more is applied between drain and source, the Zener diode is subjected to breakdown and the element is turned on thereby flyback energy generated in the load is absorbed at the ON-state of the element.

FIG. 15 shows a modeled section of a semiconductor device where a Zener diode having a protective function as above described is installed integral with a power MOSFET 10. In FIG. 15, n-type silicon substrate 11 being a drain region is provided at rear surface side with n-type region 11a of high impurity atom concentration and at a side of a main surface 11b with a number of p-type diffusion regions 12 forming a cell on a center portion (the right side in the figure), and also p-type diffusion region 13 is formed so as to surround the number of p-type diffusion regions 12. In the p-type diffusion regions 12 respectively forming the cell, n-type diffusion region 14 is formed where n-type impurities to become source region are diffused at high concentration. Also in a peripheral portion of the main surface 11b, n-type diffusion region 15 of high concentration for contact used also as a channel stopper is formed.

A gate oxide film 16 is formed on a surface between neighboring p-type diffusion regions 12, and a channel is formed in the p-type diffusion regions 12 by a gate electrode 17 of polycrystalline silicon provided on an upper portion of the gate oxide film 16. In regions from the p-type diffusion region 13 of the main surface 11b to the n-type diffusion region 15 of high concentration, a silicon oxide film 18 for insulation is formed so as to cover these regions. On the silicon oxide film 18, a connecting electrode 19 is formed and positioned at the inner circumferential side and a polycrystalline silicon thin film layer 20 is formed and positioned at the outer circumferential side. The polycrystalline silicon thin film layer 20 is formed as n-type, p-type, n-type regions 20a, 20b, 20c in that order from the inner circumferential side to the outer circumferential side, thereby two Zener diodes 21, 22 subjected to breakdown at prescribed voltage are in series in the reverse direction.

The p-type diffusion region 12, the n-type diffusion region 14 and the p-type diffusion region 13 as above described are electrically connected by a surface electrode 23, and the connecting electrode 19 and the n-type region 20a of the polycrystalline silicon thin film layer 20 are electrically connected by a surface electrode 24, and the n-type region 20c of the polycrystalline silicon thin film layer 20 and the n-type diffusion region 15 are electrically connected by a surface electrode 25. A source terminal S is connected to the surface electrode 23, and a gate terminal G is connected to the gate electrode 17 and the connecting electrode 19 by the surface electrode 24, and a drain terminal D is connected to a surface electrode 26 formed at the rear surface side of the silicon substrate 11.

According to the above-mentioned constitution, if the drain terminal D side is connected to the power source through an inductive load (not shown) and the gate terminal G is supplied with a gate signal and the ON/OFF drive control is carried out, the flyback voltage generating in the load at the OFF state of the power MOSFET 10 is applied between the drain terminal D and the source terminal S. Since this applied voltage is applied through the n-type diffusion region 15 of the silicon substrate 11 and the surface electrode 25 to the polycrystalline silicon thin film layer 20 constituting Zener diodes 21, 22, when the voltage is a prescribed voltage or more, the Zener diode 22 is subjected to breakdown and the gate terminal G is supplied with voltage. Then the power MOSFET 10 is turned on and conduction occurs between the drain terminal D and the source terminal S; therefore the flyback energy of the load is absorbed. Thereby the power MOSFET 10 is prevented from the overvoltage breakdown.

In the embodiment as above described, however, since reliability of insulation characteristics of the silicon oxide film 18 is deteriorated on account of following reasons: circumstances exist that the breakdown voltage of the Zener diodes 21, 22 cannot be set large.

That is, in the above-mentioned embodiment, the voltage applied nearly to the drain terminal D as voltage applied to the n-type region 20c among the polycrystalline silicon thin film layer 20 constituting the Zener diodes 21, 22 is applied to the upper surface side of the silicon oxide film 18, and the voltage applied to the source terminal S as potential of the p-type diffusion region 13 is applied to the lower surface side of the silicon oxide film 18. Consequently the voltage applied to the thickness direction of the silicon oxide film 18 becomes maximum at the portion of the n-type region 20c, and the voltage becomes nearly the same value as that of the potential difference applied between the drain D and the source S of the power MOSFET 10.

Since the voltage applied to the power MOSFET 10 is limited by the breakdown voltage of the Zener diodes 21, 22 as above described, if the breakdown voltage is to be set large, also the potential difference applied to the thickness direction of the silicon oxide film 18 becomes large. Therefore in the silicon oxide film 18, since the electric field intensity for the thickness direction becomes larger, reliability for the dielectric breakdown is deteriorated. In other words, the breakdown voltage of the Zener diodes 21, 22 is restricted in that it cannot be set to the dielectric breakdown strength of the silicon oxide film 18 or more.

SUMMARY OF THE INVENTION

In view of the above-mentioned circumstances, an object of the present invention is to provide a semiconductor device wherein even if a potential difference between a first semiconductor element formed at the semiconductor substrate side and a second semiconductor element formed on an insulation film becomes large, excessive voltage is not applied to the insulation film thereby the reliability of the dielectric breakdown of the insulation film can be prevented from being deteriorated.

A semiconductor device of the present invention comprises a first semiconductor element including a semiconductor substrate of first conduction type and an impurity diffusion region of second conduction type formed on its main surface, an insulation film covering the main surface of the semiconductor substrate, and a second semiconductor element formed and positioned on a peripheral portion of the impurity diffusion region on the insulation film and connected electrically between terminals of the first semiconductor element, wherein the second semiconductor element is arranged on the region to which intermediate potential between the impurity diffusion region and the semiconductor substrate is set.

More specifically, the second semiconductor element is arranged and set so that potential distribution of a depletion layer extending from the PN junction between the impurity diffusion region and the semiconductor substrate to the semiconductor substrate side and potential difference in the second semiconductor element are matched.

Also a ring-shaped diffusion region formed so as to surround the periphery of the impurity diffusion region with specified spacing is provided on the main surface of the semiconductor substrate, and the second semiconductor element may be formed and positioned on the upper portion of the ring-shaped diffusion region.

According to the semiconductor device of the present invention, if the voltage of reverse bias is applied to the pn junction part of the first semiconductor element formed between the semiconductor substrate and the impurity diffusion region, the voltage is applied also to the second semiconductor element connected electrically to the first semiconductor element. Then in the inside of the semiconductor substrate, the depletion layer region having width corresponding to amount of the voltage is formed at the outside of the impurity diffusion region. On the other hand, since the voltage applied to the second semiconductor element has potential distribution, the potential is applied to the upper surface portion of the insulation film.

Consequently, the potential difference between the voltage applied to the terminal of the second semiconductor element on the insulation film and the voltage applied to the lower surface side of the insulation film becomes less than the voltage applied between the semiconductor substrate and the impurity diffusion region. Thereby since the potential difference in the thickness direction of the insulation film can be decreased, reliability for of the dielectric breakdown of the insulation film can be substantially improved. In other words, the voltage applied to the second semiconductor element can be set even large.

Also when the ring-shaped diffusion region is provided, the depletion layer region formed at the outside of the impurity diffusion region becomes wide, and if it approaches to the ring-shaped diffusion region, the potential at that time is shared by the ring-shaped diffusion region. That is, the ring-shaped diffusion region shares the voltage having a value between the voltage of the semiconductor substrate and the voltage of the impurity diffusion region.

Consequently, the potential difference between the voltage applied to the terminal of the second semiconductor element on the insulation film and the voltage applied to the lower surface side of the insulation film becomes less than the voltage applied between the semiconductor substrate and the impurity diffusion region. Thereby since the potential difference in the thickness direction of the insulation film can be decreased, the reliability for the dielectric breakdown of the insulation film can be substantially improved. In other words, the voltage applied to the second semiconductor element can be set even large.

DETAILED DESCRIPTION OF THE PREFERRED EMBODIMENTS

The present invention will be described regarding a first embodiment when the present invention is applied to a semiconductor element of a longitudinal type power MOSFET of n channels and a protective Zener diode connected between drain and gate of the power MOSFET referring to FIGS. 1 to 7 as follows.

Figure 1:
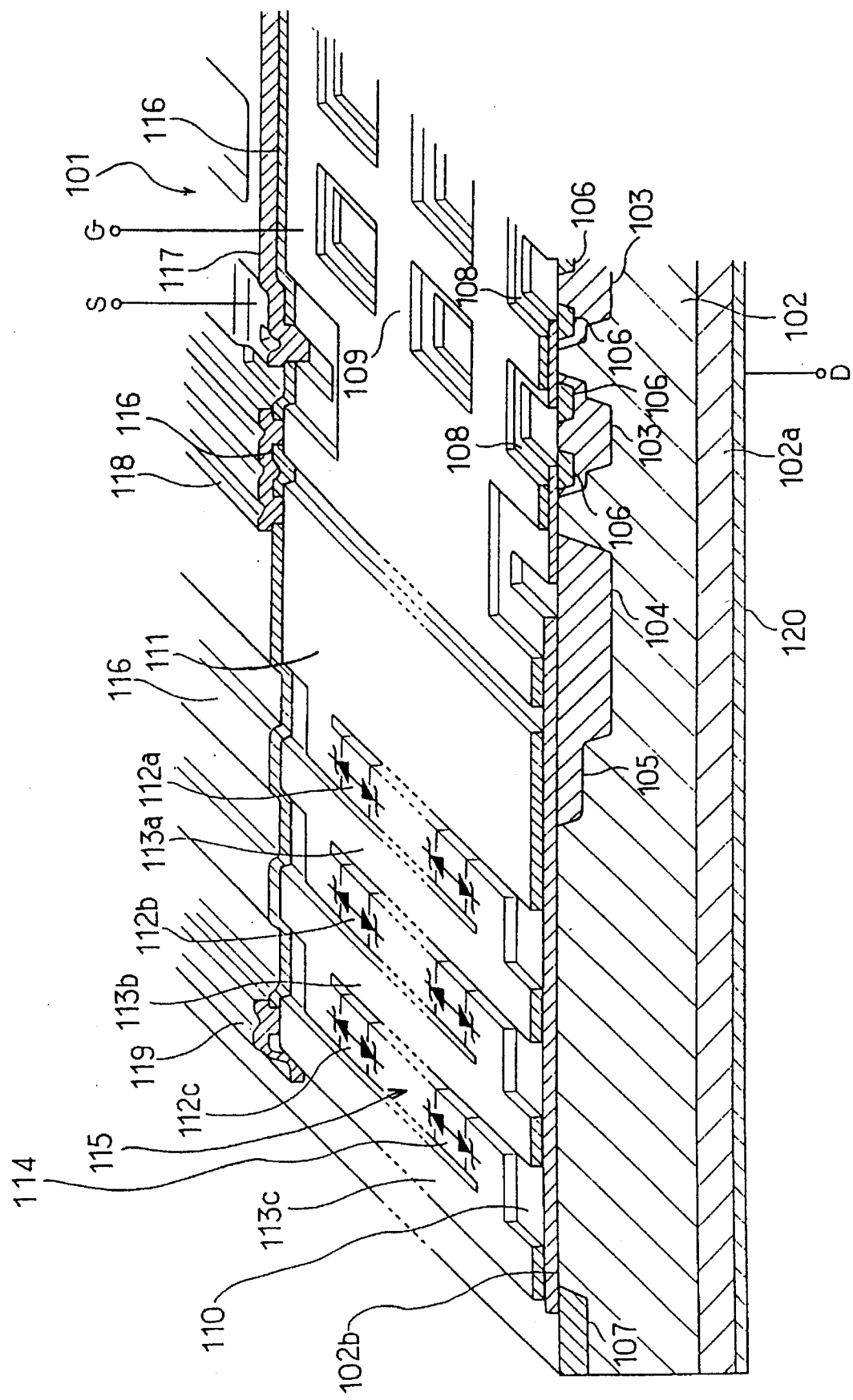
FIG. 1 is a perspective view of main part of a first embodiment of the invention shown in cross-section section.

FIG. 1 shows main part of a power MOSFET 101 as a first semiconductor element in modeled longitudinal section. In FIG. 1, a silicon substrate 102 as a semiconductor substrate formed in n type as first conduction type becomes a drain region, and has n-type region 102a of high impurity atom concentration at its rear surface side. A number of p-type diffusion regions 103 to form a cell at a center portion (the right side in the figure) are provided at the side of a main surface 102b of the silicon substrate 102, and also p-type diffusion region 104 is formed so surround the number of p-type diffusion regions 103. At the outer circumferential side of the p-type diffusion region 104 p-type diffusion region 105 with diffusion depth being shallow in comparison with the inner circumferential side is formed in to coupled state.

In the inside of the p-type diffusion regions 103 to form the cell respectively, impurities of n type are diffused at high concentration and n-type diffusion region 106 becoming a source region is formed. Also at a peripheral portion of the main surface 102b, n-type diffusion region 107 of high concentration for contact serving also as a channel stopper is formed. A gate oxide film 108 is formed covering between the neighboring p-type diffusion regions 103 and between the p-type diffusion region 103 and the p-type diffusion region 104, and a gate electrode 109 of polycrystalline silicon is formed on the gate film 108. The gate electrode 109 forms a channel region on the upper layer portion of the p-type diffusion region 103 in response to a given gate voltage.

In the region from the p-type diffusion region 104 of the main surface 102b to the high concentration n-type diffusion region 107, a silicon oxide film 110 as an insulation film is formed to cover these regions. On the upper portion at the inner circumferential side of the silicon oxide film 110, a gate plate 111 of polycrystalline silicon is formed to extend from the p-type diffusion region 105 to the outer circumferential side to the gate electrode 109. Since the gate plate 111 is at the same potential as that of the gate electrode 109, when reverse bias is applied to the pn junction composed of the p-type diffusion regions 104, 105 and the n-type silicon substrate 102, the gate plate 111 acts to hold the part of the main surface 102b side of the generated depletion layer to the same potential as that of the gate electrode 109 through the silicon oxide film 110, and if the applied reverse bias is sufficiently more than the potential of the gate electrode 109, the electric field at the main surface 102b side of the silicon substrate 102 is relieved.

Also on the silicon oxide film 110 at the outer circumferential side of the gate plate 111, element parts 112a, 112b, 112c constituted by polycrystalline silicon thin film layers with Zener diode parts formed along the circumferential direction and equipotential plates 113a, 113b, 113c constituted by polycrystalline silicon thin film layers formed in ring shape along the outer circumference of the gate plate 111 are arranged alternately. These are formed along the circumferential direction and therefore arranged in parallel to the end portion of the p-type diffusion region 105.

In the element parts 112a, 112b, 112c respectively, impurities of n type and p type are formed alternately along the circumferential direction, and a plurality of Zener diode pairs 114 each composed of Zener diodes connected in series in reverse directions are formed and respective both terminals are electrically connected between the neighboring gate plate 111 and the equipotential plate 113a, 113b or 113c. A Zener diode group 115 is formed by these Zener diode pairs 114. In this case, in the Zener diode pair 114, for example, the breakdown voltage Vz is set to 6 V, and in the Zener diode group 115 as a whole, the breakdown voltage VZ is set to 380 V.

On the silicon oxide film 110 and the gate oxide film 108, BPSG (boron phosphorus contained silicon glass) protective films 116 having insulation properties are formed so as to cover the element parts 112a to 112c, the equipotential plates 113a to 113c, the gate plate 111 and the gate electrode 109. A window to make electrical contact is formed in prescribed position of these BPSG protective films 116.

The p-type diffusion region 103, the n-type diffusion region 106 and the p-type diffusion regions 104, 105 as above described are electrically connected by a surface electrode 117, the gate electrode 109 and the gate plate 111 are electrically connected by a surface electrode 118, and the equipotential plate 113c and the n-type diffusion region 107 are electrically connected by a surface electrode 119. A source terminal S is connected to the surface electrode 117, and a gate terminal G is connected to the surface electrode 118, the gate electrode 109 and the gate plate 111, and a drain terminal D is connected to a surface electrode 120 formed at the rear surface side of the n-type region 102a of the silicon substrate 102.

Figure 2:
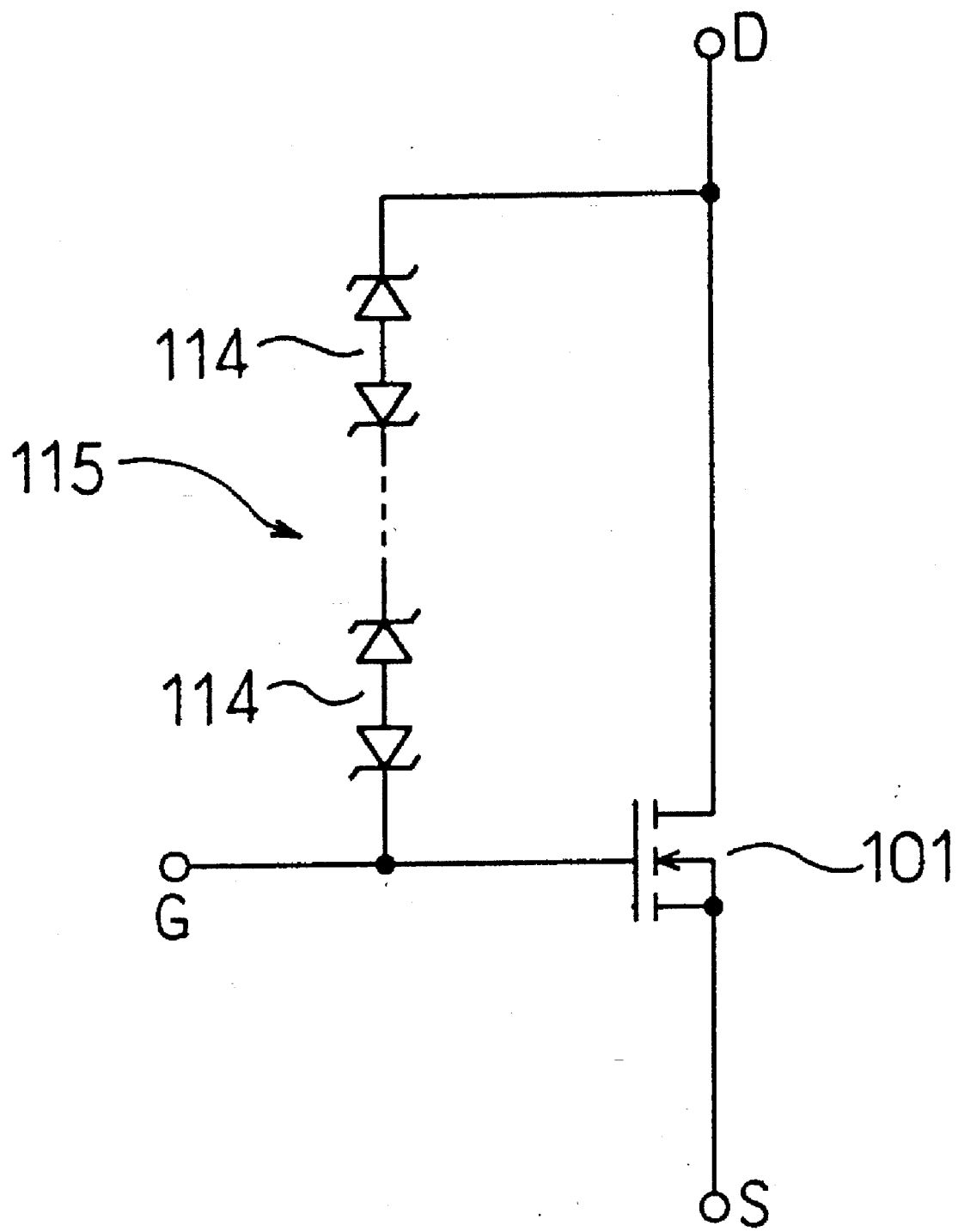
FIG. 2 is a schematic diagram of the first embodiment.

FIG. 2 shows a schematic digram, where a Zener diode group 115 constituted by a plurality of Zener diode pairs 114 in series connection is connected between a drain terminal D and a gate terminal G of a power MOSFET 101. For example, in the state that the drain terminal D is connected through an inductive load to the positive power source terminal and the source terminal S is grounded, the power MOSFET 101 controls conduction or interruption to the load by the control voltage supplied to the gate terminal G.

Next, functions of this embodiment will be described. In the power MOSFET 101, in the OFF-state that the control voltage is not supplied to the gate terminal G, the power source voltage is applied as drain voltage to the drain terminal D through an inductive load (not shown). The drain voltage is supplied also to the Zener diode group 115. The breakdown voltage Vz of the Zener diode group 115 is set to value higher than the power source voltage so that breakdown does not occur in this state. Consequently, the potential of the gate terminal G does not fluctuate due to the drain voltage.

In the above-mentioned state, the power source voltage applied between the drain terminal D and the source terminal S is applied in reverse direction to the pn junction between the silicon substrate 102 and the p-type diffusion regions 103, 104, 105, and is applied also to the equipotential plates 113a to 113c and the element parts 112a to 112c to constitute the Zener diode group 115. In this case, since the equipotential plate 113c is connected through the surface electrode 119, the n-type diffusion region 107 and the silicon substrate 102 to the drain terminal D, a nearly equal voltage is applied to the equipotential plate 113c.

In the pn junction part between the silicon substrate 102 and the p-type diffusion regions 103, 104, 105, since the impurity atom concentration of the silicon substrate 102 is set low, the depletion layer having a width corresponding to the drain voltage spreads largely to the silicon substrate 102 side in the direction away from the pn junction surface, and the depletion layer part shares the drain voltage.

Then in the upper portion of the silicon substrate 102, since the potential corresponding to the connection stage number of each Zener diode pair 114 of the Zener diode group 115 is distributed, the equipotential plates 113a to 113c respectively share the intermediate potential in sequence from the potential applied to the drain terminal D from the equipotential plates 113c to 113a, and the potential difference becomes small for the potential distribution of the depletion layer formed at these lower portions through the silicon oxide film 110.

Consequently in the silicon oxide film 110, since the voltage applied between the upper and lower surfaces of the region from the outer circumferential part of the p-type diffusion regions 104, 105 to the n-type diffusion region 107 is decreased, the electric field intensity can be lowered. Thereby the silicon oxide film 110 having the same dielectric breakdown strength as that of the prior art can substantially improve the reliability of the dielectric breakdown for the Zener diode group 115 constituted by a plurality of Zener diode pairs 114. In other words, the breakdown voltage Vz of the Zener diode group 115 can be set to an even larger value.

In the power MOSFET 101, if the control voltage of the ON-operation is applied to the gate terminal G, the voltage applied to the gate electrode 109 is applied through the gate oxide film 108 to the p-type diffusion region 103, and a channel is formed in this part and the conduction state is produced between the drain terminal D and the source terminal S; thereby current flows through the inductive load.

If the control voltage of the OFF-operation is applied to the gate terminal G, the channel of the p-type diffusion region 103 is lost and the interruption state is produced between the drain terminal D and the source terminal S. Thereby the current flowing to the inductive load is interrupted, and in this state, the flyback voltage generated in the inductive load is applied to the drain terminal D of the power MOSFET 101. If the flyback voltage becomes higher than the power source voltage and exceeds the breakdown voltage Vz of the Zener diode group 115, the voltage value of the flyback voltage subtracted by the breakdown voltage Vz is applied to the gate terminal G. Then the power MOSFET 101 is turned on again by the gate voltage and goes into the conductive state and absorbs the flyback energy of the inductive load. Thereby the power MOSFET 101 is prevented from the overvoltage breakdown due to the flyback voltage.

According to this embodiment, the Zener diode group 115 comprising a plurality of Zener diode pairs 114 is installed and the power MOSFET 101 is prevented from reaching the overvoltage breakdown, since the polycrystalline silicon element parts 112a to 112c to constitute the plural Zener diode pairs 114 of the Zener diode group 115 and the equipotential plates 113a to 113c to connect these element parts electrically are formed, the potential difference in the film thickness direction of the silicon oxide film 110 at the lower portion of the Zener diode group 115 can be lowered. Thereby the dielectric breakdown strength of the silicon oxide film 110 can be substantially improved. In other words, the breakdown voltage Vz of the Zener diode group 115 can be further enlarged.

Figure 3:
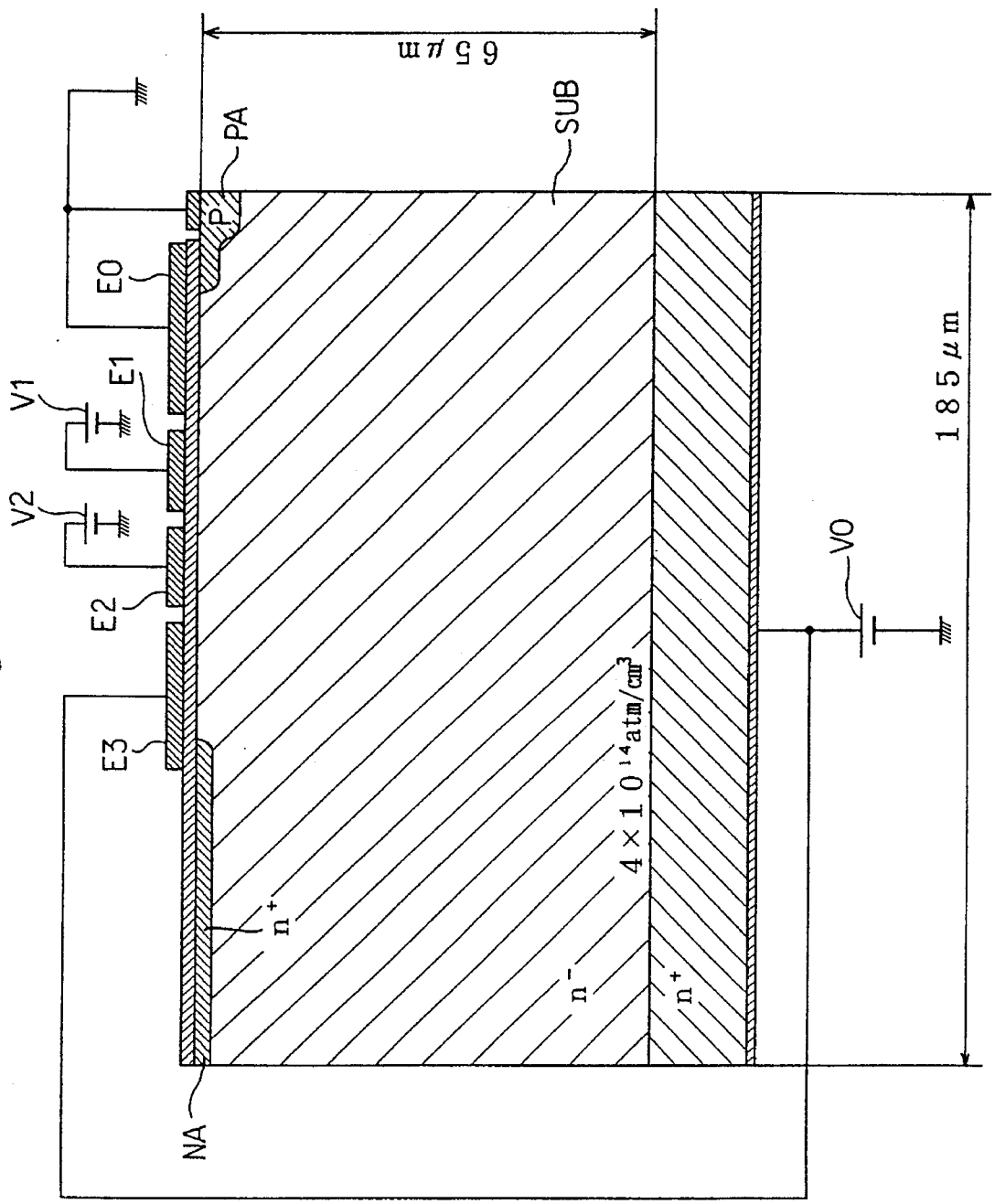
FIG. 3 is a modeled longitudinal sectional side view of a simulation model of the first embodiment.

The inventors have confirmed effects of the withstand voltage improvement according to the above-mentioned constitution in carrying out simulation by a computer using the structure model shown in FIG. 3. That is, a silicon substrate SUB (n-type impurity atom concentration is $4 \times 10^{14}$ atm/cm$^3$ and thickness is 65 μm) in FIG. 3 is set so that corresponding to the silicon substrate 102, and p-type diffusion region region PA corresponding to the p-type diffusion regions 104, 105 is provided on the right end at the main surface side of the upper portion of the substrate SUB. Also n-type diffusion region NA corresponding to the n-type diffusion region 107 is provided on the left end at the main surface side of the upper portion of the silicon substrate SUB.

A silicon oxide film SIO with thickness of 0.8 μm corresponding to the silicon oxide film 110 is arranged on the main surface of the silicon substrate SUB, and electrodes E0 to E3 corresponding to the gate plate 111, the equipotential plates 113a to 113c are arranged on the upper portion of the main surface so that the equivalent potential to the power MOSFET 101 is given from the outside. In the actual power MOSFET 101, the Zener diode pairs 114 are formed between the equipotential plates 113a to 113c respectively, but in this simulation, the voltage supplied to each of the equipotential plates 113b and 113c by the Zener diode group 115 is supplied to the electrodes E1 and E2 by the power sources V1 and V2 having prescribed voltages respectively from the outside.

In the simulation, the potential distribution within the silicon substrate SUB is calculated when a voltage of 380 V as V0 for example is applied between the terminal D of the silicon substrate SUB and the terminal S of the p-type diffusion region PA. Then the power sources V1 and V2 are set so that the potential difference becomes equal between the electrodes E0–E1, between the electrodes E1–E2 and between the electrodes E2–E3.

Figure 4:
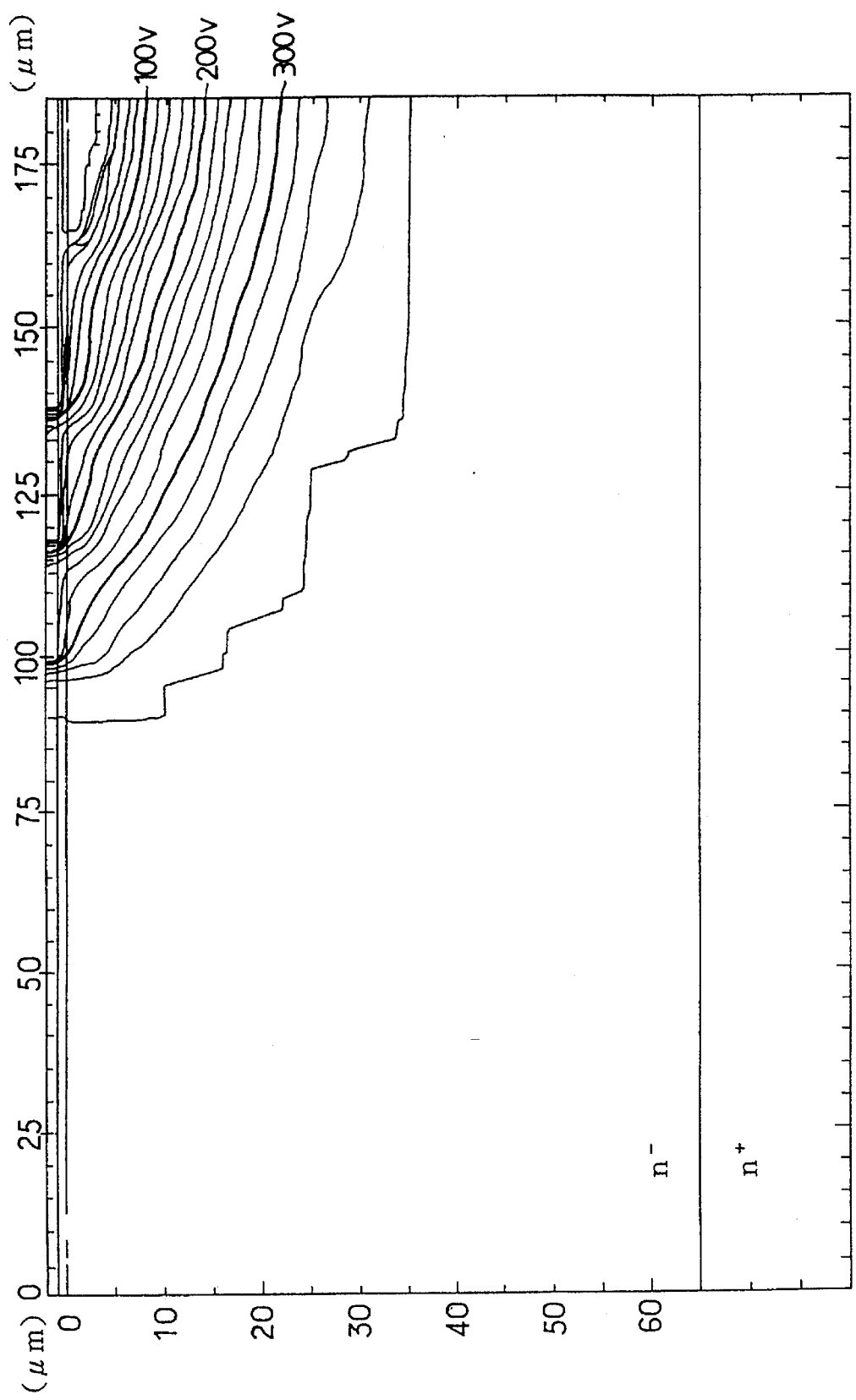
FIG. 4 is a potential distribution diagram within a silicon substrate estimated by simulation.
Figure 5:
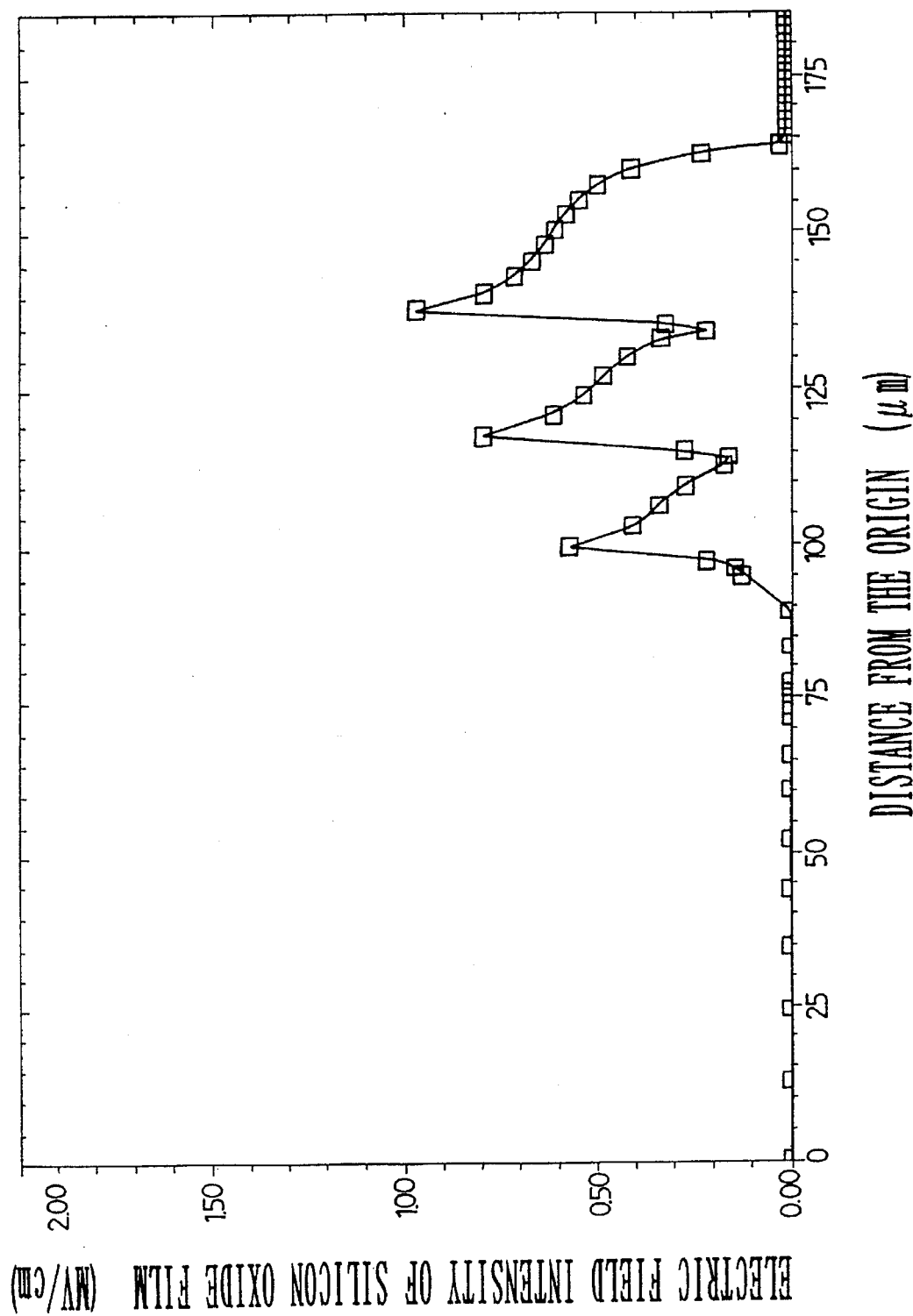
FIG. 5 is an electric field intensity distribution diagram of a silicon oxide film estimated by simulation.

This result is shown in FIG. 4. That is, FIG. 4 shows the potential distribution within the silicon substrate SUB in the equipotential lines at intervals of 20 V, where each equipotential line extends in the direction of spreading the depletion layer in the vicinity of the surface of the silicon substrate SUB and the potential difference between the upper and lower surfaces of the silicon oxide film SIO is reduced. It is found that the maximum value of the electric field intensity of the silicon oxide film SIO in this state is 1 MV/cm or less as shown in FIG. 5, and this value is sufficiently small in comparison with 7–8 MV/cm being the value of the critical electric field intensity for the silicon oxide film to be subjected to the dielectric breakdown and is virtually insignificant from the viewpoint of reliability.

Figure 6:
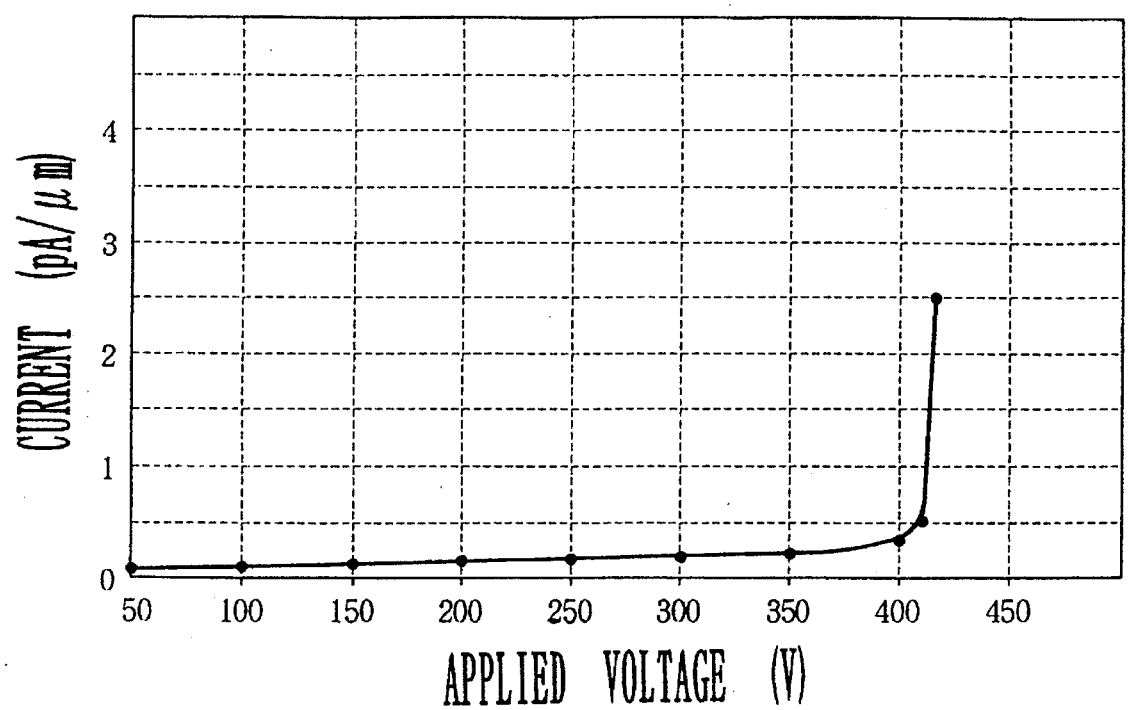
FIG. 6 is a withstand voltage characteristic (reverse direction current characteristic) diagram estimated by simulation.

Also when the applied voltage V0 is increased in the above-mentioned constitution, it is found that the withstand voltage between the p-type diffusion region PA and the silicon substrate SUB is about 415 V as shown in FIG. 6. As a result, when the withstand voltage between the drain D and the gate G of the power MOSFET 101 is sufficiently large in comparison with 380 V being the clamp voltage by the Zener diode group 115 and moreover the voltage of 380 V or more is applied between the drain D and the gate G, the pn junction composed of the p-type diffusion region PA and the silicon substrate SUB is not subjected to breakdown but the Zener diode group 115 is subjected to breakdown.

Figure 7:
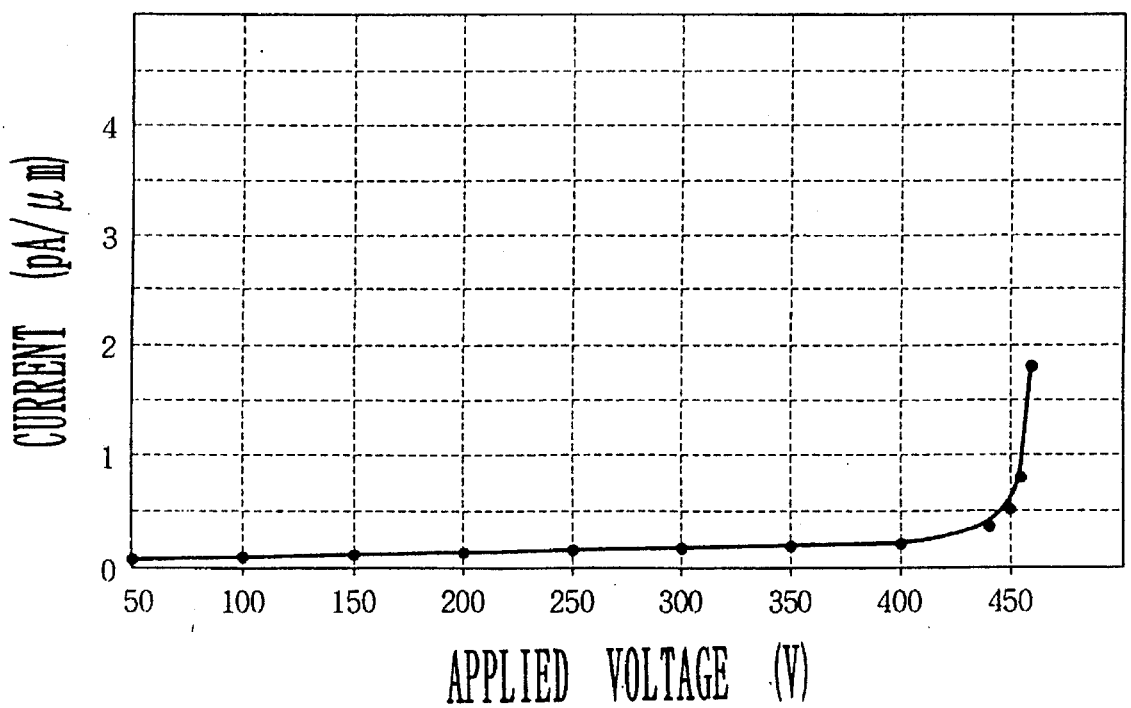
FIG. 7 is a diagram corresponding to FIG. 6 when power source voltages V1, V2 are optimized.

The inventors further tried that in the above-mentioned simulation, values of the power source voltages V1 and V2 are optimized and the breakdown voltage of the pn junction between the p-type diffusion region PA and the silicon substrate SUB is raised, and for example, when the ratio of the potential difference between the electrodes E0–E1, the potential difference between the electrodes E1–E2 and the potential difference between the electrodes E1–E2 is made 12:19:26, it is found that the withstand voltage becomes 460 V as shown in FIG. 7.

This shows that when the connection number of the Zener diode pairs 114 of the Zener diode group 115 giving voltage corresponding to the power source voltages V1 and V2 is adjusted and the shared voltage of the element parts 112a to 112c is set to the optimum value, the above-mentioned voltage 460 V can be obtained.

According to this embodiment, the Zener diode group 115 is provided and the power MOSFET 101 is prevented from the overvoltage breakdown, since the element parts 112a to 112c and the equipotential plates 113a to 113c by polycrystalline silicon to constitute the Zener diode group 115 are electrically connected and the applied voltage between the drain electrode D and the gate electrode G is properly distributed to the equipotential plates 113a to 113c and the potential is held, the width of the depletion layer spreading on the main surface of the silicon substrate 102 is widened and the electric field intensity is lowered and the withstand voltage is improved, and the potential difference applied to the silicon oxide film 110 is lowered and the dielectric breakdown strength can be improved substantially.

In this first embodiment, although the Zener diode group 115 has a Zener voltage of 380 V, the invention is not limited to this but the number of the Zener diode pairs 114 may be properly increased or decreased and the desired Zener voltage VZ can be set.

Figure 8:
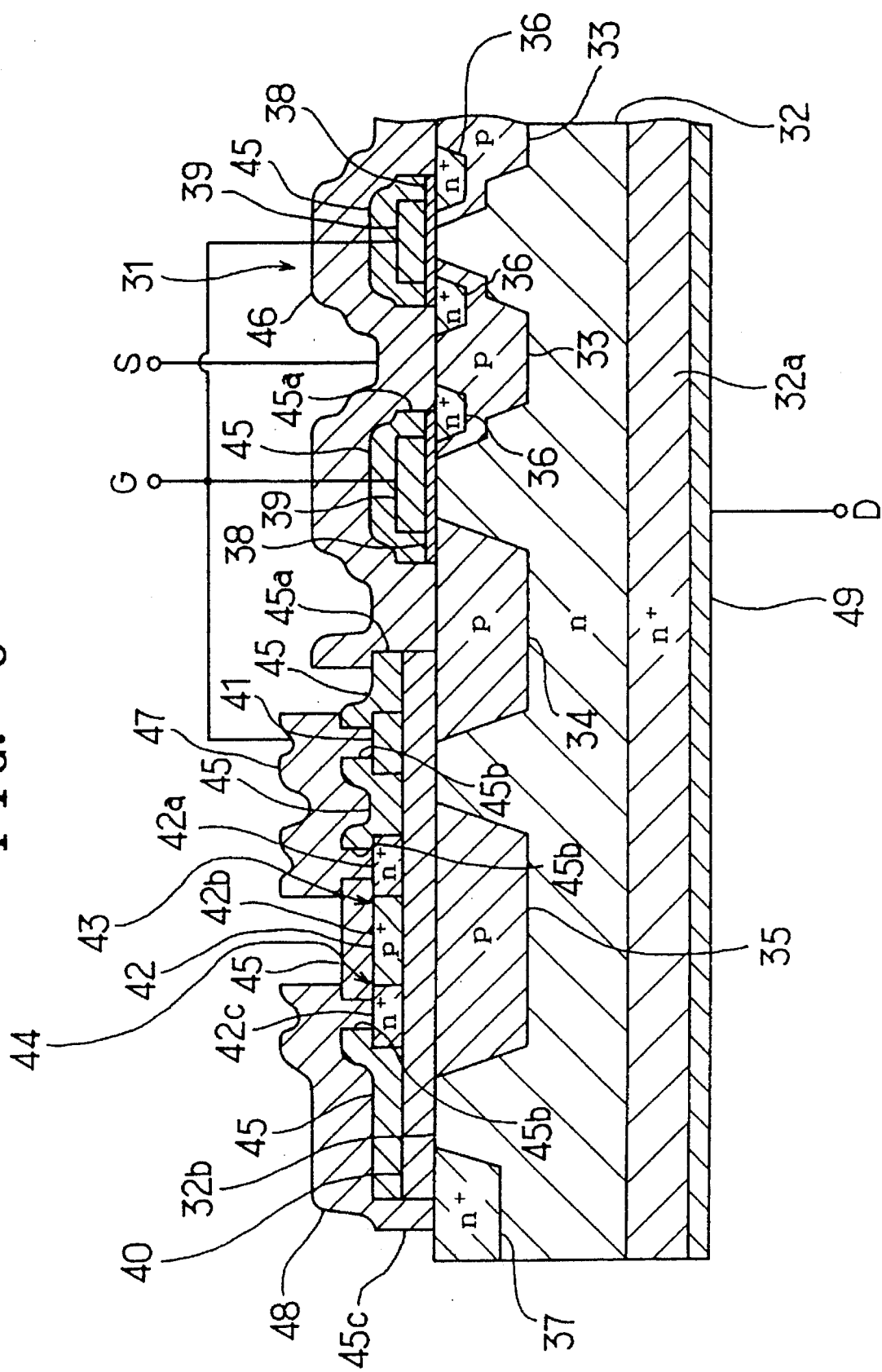
FIG. 8 is a modeled longitudinal sectional side view of main part of a second embodiment of the invention.
Figure 9:
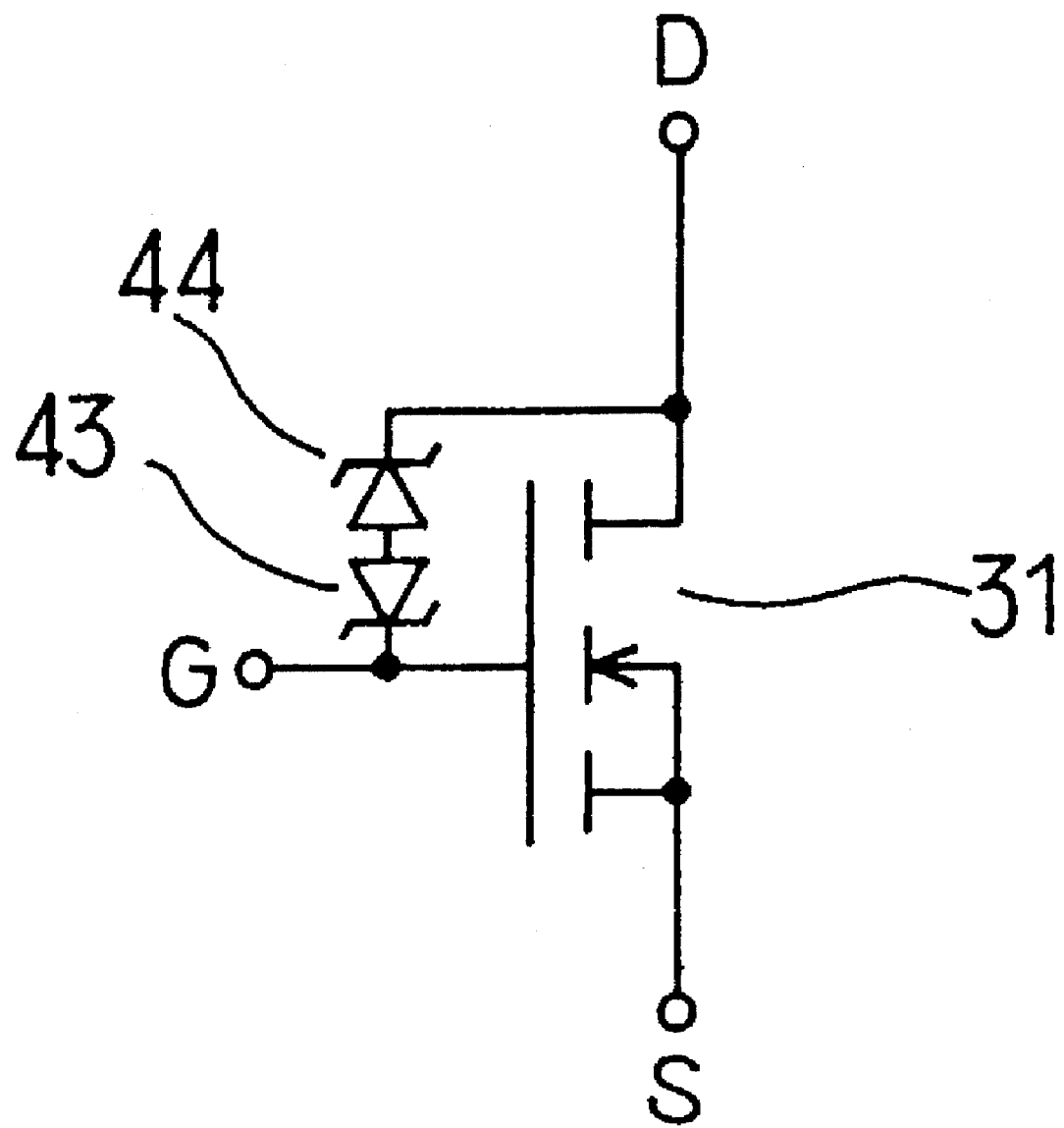
FIG. 9 is a diagram corresponding to FIG. 2 showing the second embodiment.

FIGS. 8 and 9 show a second embodiment of the present invention, and this will be described as follows.

FIG. 8 shows main part of a power MOSFET 31 as a first semiconductor element in modeled longitudinal section. In FIG. 8, a silicon substrate 32 as a semiconductor substrate formed in n type as a first conduction type becomes a drain region, and has n-type region 32a of high impurity atom concentration at its rear surface side. A number of p-type diffusion regions 33 to form a cell at a center portion (the right side in the figure) are provided at side of a main surface 32b of the silicon substrate 32, and also p-type diffusion region 34 is formed so as to surround the number of p-type diffusion regions 33. At the outer circumferential part of the p-type diffusion region 34, a ring-shaped diffusion region 35 with p-type impurities diffused is formed so as to surround the p-type diffusion region 34 with prescribed spacing.

In the inside of the p-type diffusion regions 33 to form the cell respectively, n-type diffusion region 36 (source region) with impurities of n type diffused at a high concentration is formed. Also at a peripheral portion of the main surface 32b, n-type diffusion region 37 of high concentration for contact serving also as a channel stopper is formed. A gate oxide film 38 is formed covering between the neighboring p-type diffusion regions 33 and between the p-type diffusion region 33 and the p-type diffusion region 34, and a gate electrode 39 of polycrystalline silicon is formed on the gate film 38. The gate electrode 39 forms a channel region on the upper layer portion of the p-type diffusion region 33 in response to given gate voltage.

In the region from the p-type diffusion region 34 of the main surface 32b to the high concentration n-type diffusion region 37, a silicon oxide film 40 as an insulation film is formed so as to cover these regions. On the silicon oxide film 40, a connecting electrode 41 is formed and positioned at the inner circumferential side, and a polycrystalline silicon thin film layer 42 is formed and positioned at the outer circumferential side. Also the polycrystalline silicon thin film layer 42 is formed by introducing impurities from the inner circumferential side towards the outer circumferential side in a ring shape in sequence into n-type, p-type, n-type regions 42a, 42b, 42c thereby having the two pn junctions. By these two pn junctions, the two Zener diodes 43, 44 are subjected to breakdown at the prescribed voltage Vz connected in series in reverse directions.

On the silicon oxide film 40 and the gate oxide film 38, BPSG (boron phosphorus contained silicon glass) protective films 45 having insulation properties are formed to cover the polycrystalline silicon thin film layer 42 and the gate electrode 39 respectively. Windows 45a, 45b, 45c to make electric contact are formed in prescribed positions of these BPSG protective films 45.

The p-type diffusion region 33, the n-type diffusion region 36 and the p-type diffusion region 34 as above described are electrically connected by a surface electrode 46, and the connecting electrode 41 and the n-type impurity region 42a of the polycrystalline silicon thin film layer 42 are electrically connected by a surface electrode 47, and the n-type impurity region 42c of the polycrystalline silicon thin film layer 42 and the n-type diffusion region 37 are electrically connected by a surface electrode 48. A source terminal S is connected to the surface electrode 46, and a gate terminal G is connected to the gate electrode 39 and the connecting electrode 41, and a drain terminal D is connected to a surface electrode 49 formed at the rear surface side of the silicon substrate 32. The p-type ring-shaped diffusion region 35 is provided in non-connected state to any of surface electrode 46, 47 or 48 and therefore in a floating state electrically.

FIG. 9 shows schematic diagram, where a circuit constituted by Zener diodes 43 and 44 in series connection with reverse polarities is connected between a gate terminal G and a drain terminal D of a power MOSFET 31. For example, in the state that the drain terminal D is connected through an inductive load to the positive power source terminal and the source terminal S is earthed, the power MOSFET 31 controls conduction or interruption to the load by the control voltage supplied to the gate terminal G.

Next, functions of this embodiment will be described. In the power MOSFET 31, in the OFF-state that the control voltage is not supplied to the gate electrode G, the power source voltage is applied as drain voltage to the drain terminal D through an inductive load (not shown). The drain voltage is supplied also to the series circuit of the Zener diodes 43, 44. The breakdown voltage Vz of the Zener diodes 43, 44 is set to a value higher than the power source voltage so that breakdown does not occur in this state. Consequently, the potential of the gate terminal G does not fluctuate due to the drain voltage.

In the above-mentioned state, the power source voltage applied between the drain terminal D and the source terminal S is applied in a reverse direction to the pn junction between the silicon substrate 32 and the p-type diffusion regions 33, 34, and is applied also between the n-type region 42c and the p-type region 42b to constitute the Zener diode 44. In this case, nearly the same voltage as that of the drain terminal D is applied to the n-type region 42c through the surface electrode 48, the n-type diffusion region 37 and the silicon substrate 32.

In the pn junction part between the silicon substrate 32 and the p-type diffusion regions 33, 34, the depletion layer having a width corresponding to the drain voltage spreads largely to the silicon substrate 32 side in the direction away from the pn junction surface, and the depletion layer part shares the drain voltage. Then in the ring-shaped diffusion region 35, since potential is not fixed, the potential depends on potential in part to which the depletion layer spreading from the pn junction surface between the silicon substrate 32 and the p-type diffusion region 34 attains. That is, the potential of the ring-shaped diffusion diffusion region 35 becomes a value lower than the drain voltage (power source voltage) and higher than the source voltage (ground).

Thereby voltage of nearly the ring-shaped diffusion region 35 is applied to the lower surface side of the silicon oxide film 40 positioned at the upper side of the ring-shaped diffusion region 35. On the other hand, since nearly the drain voltage is applied to the n-type region 42c of the polycrystalline silicon thin film layer 42 positioned at the upper surface side of the silicon oxide film 40 as above described, in this the part, voltage applied in the film thickness direction of the silicon oxide film 40 becomes a lower voltage than the drain voltage. Also since the p-type region 42b and the n-type region 42a of the polycrystalline silicon thin film layer 42 become nearly the ground potential, in this part, voltage applied in the film thickness direction of the silicon oxide film 40 becomes a lower voltage than the drain voltage.

When the arrangement position of the ring-shaped diffusion region 35 is properly selected, the voltage applied in the film thickness direction can be set to nearly intermediate value of voltage applied between the drain terminal D and the source terminal S. Thereby the silicon oxide film 40 having the same dielectric breakdown strength as that of the prior art can substantially improve the reliability of the dielectric breakdown for the Zener diodes 43, 44. In other words, the breakdown voltage Vz of the Zener diodes 43, 44 can be set to an even larger value.

In the power MOSFET 31, if the control voltage of the ON-operation is applied to the gate terminal G, the voltage applied to the gate electrode 39 is applied through the gate oxide film 38 to the p-type diffusion region 33, and a channel is formed in this part and the conduction state is produced between the drain terminal D and the source terminal S; thereby current flows through the inductive load.

If the control voltage of the OFF-operation is applied to the gate terminal G, the channel of the p-type diffusion region 33 is lost and the interruption state is produced between the drain terminal D and the source terminal S. Thereby the current flowing to the inductive load is interrupted, and in this state, the flyback voltage generated in the inductive load is applied to the drain terminal D of the power MOSFET 31. If the flyback voltage becomes higher than the power source voltage and exceeds the breakdown voltage Vz of the Zener diode 43, the voltage value of the flyback voltage subtracted by the breakdown voltage Vz is applied to the gate terminal G. Then the power MOSFET 31 is turned on again by the gate voltage and goes into the conductive state and absorbs the flyback energy of the inductive load. Thereby the power MOSFET 31 is prevented from the overvoltage breakdown due to the flyback voltage.

According to this embodiment, when that the Zener diodes 43, 44 are installed and the power MOSFET 31 is prevented from the overvoltage breakdown, since the ring-shaped diffusion region 35 is formed in the main surface 32b of the silicon substrate 32 at a lower portion of the polycrystalline silicon thin film layer 42 to constitute the Zener diodes 43, 44, the potential of the ring-shaped diffusion region 35 can be set to the potential between the drain terminal D and the source terminal S, and the potential difference in the film thickness direction of the silicon oxide film 40 at the lower portion of the polycrystalline silicon thin film layer 42 can be lowered. Thereby the dielectric breakdown strength of the silicon oxide film 40 can be substantially improved. In other words, the breakdown voltage Vz of the Zener diodes 43, 44 can be further enlarged.

In this embodiment, although the Zener diodes 43, 44 in the polycrystalline silicon thin film layer 42 are formed by the three regions 42a, 42b, 42c in n-type, p-type, n-type, the present invention is not limited to this, but, for example, the two Zener diodes may be formed by three regions in p-type, n-type, p-type.

Figure 10:
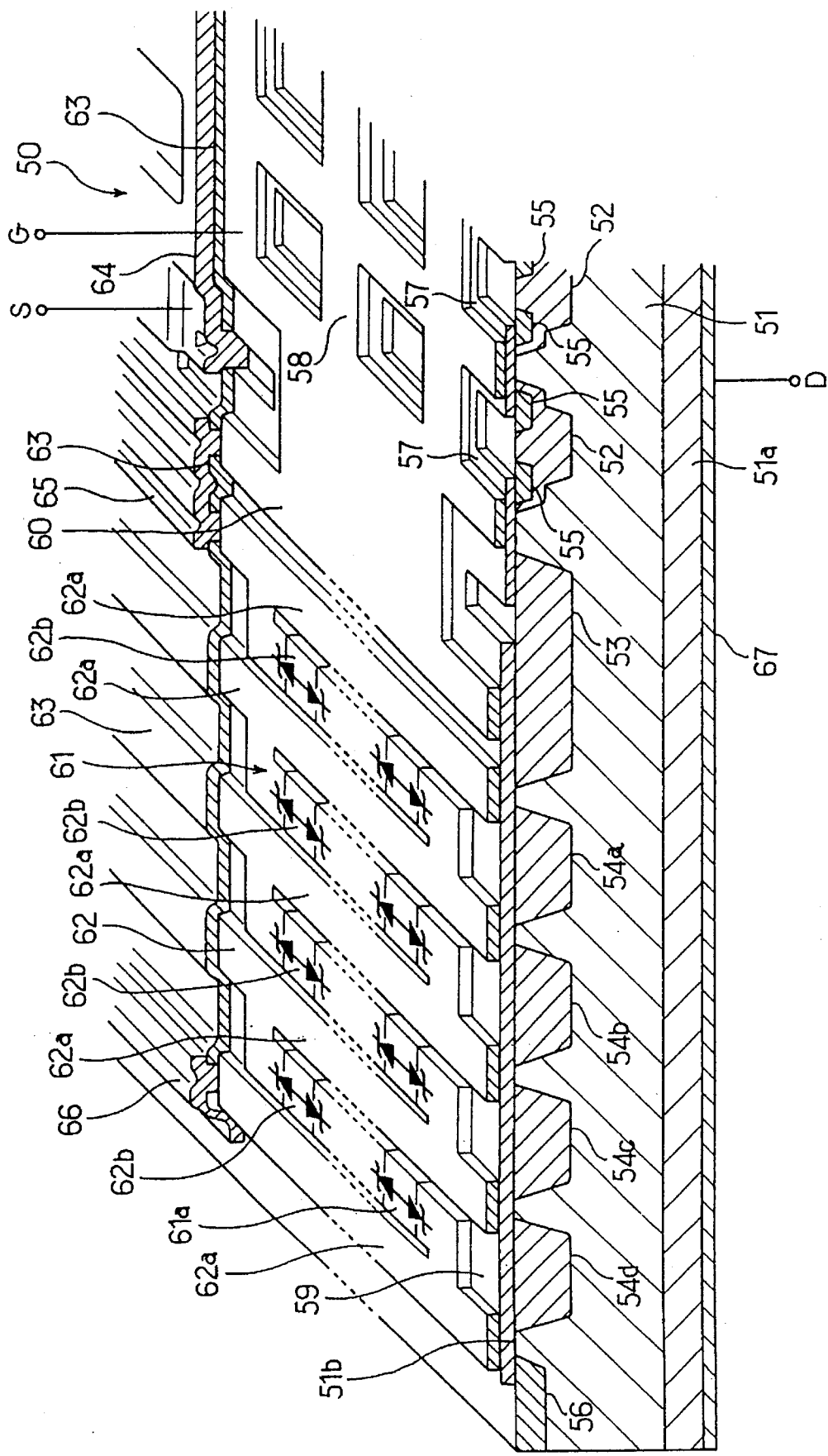
FIG. 10 is a diagram corresponding to FIG. 1 showing a third embodiment of the invention.
Figure 11:
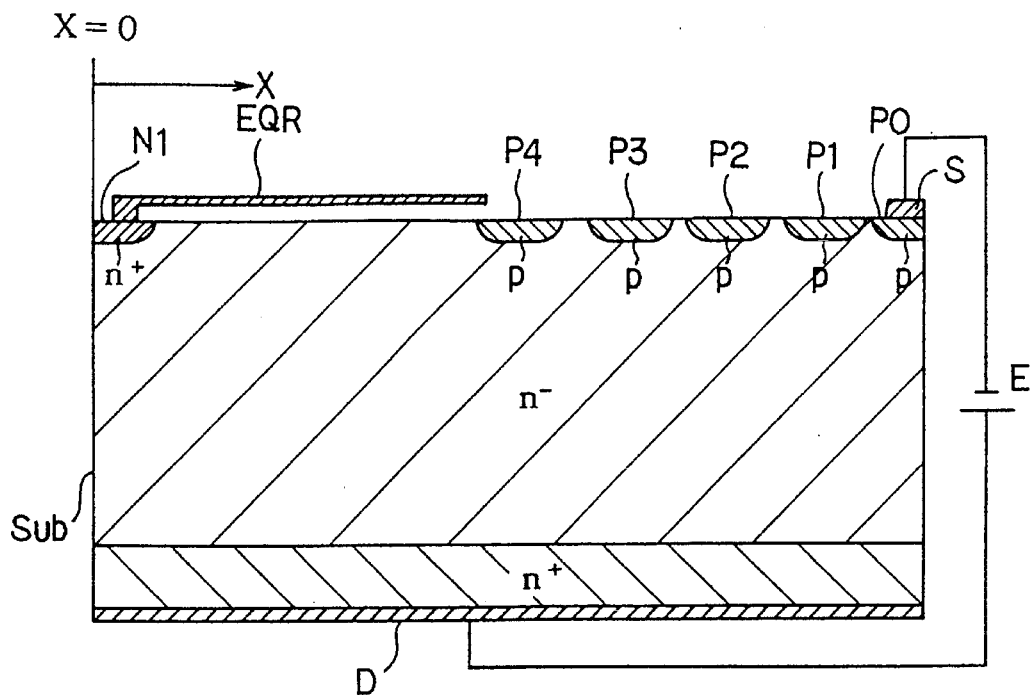
FIG. 11 is a modeled longitudinal sectional side view of a simulation model of the third embodiment.
Figure 12:
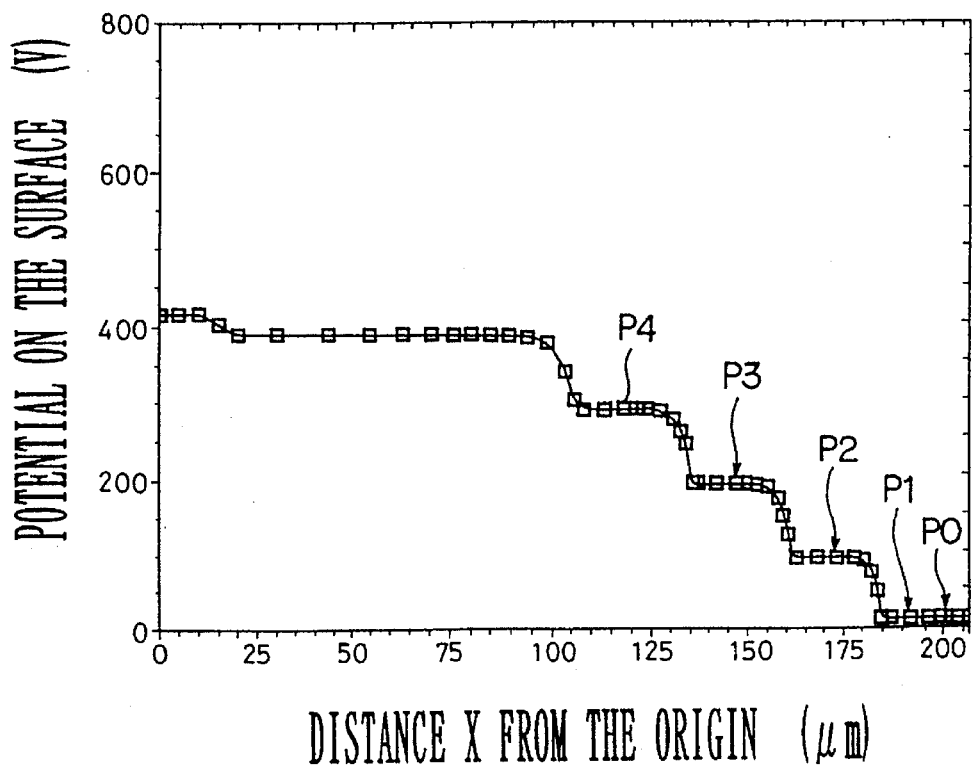
FIG. 12 is a distribution diagram showing voltage sharing of each part estimated by simulation.

FIGS. 10 to 12 show a third embodiment of the present invention, and description regarding these figures is as follows.

FIG. 10 is a perspective view in section showing main part of an n-channel power MOSFET 50 of high withstand voltage. In FIG. 10, n-type silicon substrate 1 as a semiconductor substrate has n-type region 51a at a lower layer, and on a main surface 51b at an upper surface side are formed a number of p-type diffusion regions 52 to form a cell and p-type diffusion region 53 to surround the diffusion regions 52. At the outer circumferential part of the p-type diffusion region 53, for example, four ring-shaped diffusion regions 54a to 54d with p-type impurities diffused are formed in parallel to the outer circumferential edge of the p-type diffusion region 53 so as to surround this region with prescribed spacing. In this case, the four ring-shaped diffusion regions 54a to 54d are a so-called guard ring provided to make the power MOSFET 50 high withstand voltage structure.

In the inside of the p-type diffusion region 52 to form the cell respectively, impurities of n type are diffused at high concentration and n-type diffusion region 55 becoming a source region is formed. Also at a peripheral portion of the main surface 51b, n-type diffusion region 56 of high concentration for contact serving also as a channel stopper is formed. A gate oxide film 57 is formed covering between the neighboring p-type diffusion regions 52 and between the p-type diffusion region 52 and the p-type diffusion region 53, and a gate electrode 58 of polycrystalline silicon is formed on the gate film 57. The gate electrode 58 forms a channel region on the upper layer portion of the p-type diffusion region 52 in response to given gate voltage.

In the region from the p-type diffusion region 53 of the main surface 51b to the n-type diffusion region 56, a silicon oxide film 59 as an insulation film is formed to cover these regions. On the silicon oxide film 59, a gate electrode 58 is positioned at the inner circumferential side and extended and formed as a connecting electrode 60, and at the outer circumferential side, a polycrystalline silicon thin film layer 62 to constitute a Zener diode group 61 as a second semiconductor element is formed.

The polycrystalline silicon thin film layer 62 comprises a connecting part 62a formed on a covering part between the p-type diffusion region 53 and the ring-shaped diffusion region 54a, between the ring-shaped diffusion regions 54a to 54d, between the ring-shaped diffusion region 54d and the high concentration n-type diffusion region 56 respectively, and an element part 52b formed on each of the ring-shaped diffusion regions 54a to 54d.

The connecting part 62a of the polycrystalline silicon thin film layer 62 is formed in n-type region by impurities. Also in the element part 62b, the p-type region and the n-type region are provided in sequence so that, for example, 15 pairs of Zener diode pairs 61a each composed of Zener diodes connected in series in reverse directions are formed along the circumferential direction of the ring-shaped diffusion regions 54a to 54d respectively. In order to connect these element parts 62b in series further in sequence, each element part 62b is connected at both ends to the neighboring part 62a. Thereby the Zener diode group 61 is formed so that the total 60 pairs of the Zener diode pairs 61a are connected in series.

In this case, in the Zener diode pair 61a, for example, the breakdown voltage Vz is set to 6 V, and in the Zener diode group 61 as a whole, the breakdown voltage is set to 360 V.

On the silicon oxide film 59 and the gate oxide film 57, BPSG (boron phosphorus contained silicon glass) protective films 63 having insulation property are formed to cover the polycrystalline silicon thin film layer 62 and the gate electrode 59. A window to take electric contact is formed in prescribed position of these BPSG protective films 45. The p-type diffusion region 52, the n-type diffusion region 55 and the p-type diffusion region 53 as above described are electrically connected by a surface electrode 64, and the connecting electrode 60 and the connecting part 62a at the inner circumferential side of the polycrystalline silicon thin film layer 62 are electrically connected by a surface electrode 65, and the connecting part 62a at the outer circumferential side of the polycrystalline silicon thin film layer 62 and the n-type diffusion region 56 are electrically connected by a surface electrode 66.

A source terminal S is connected to the surface electrode 64, and a gate terminal G is connected to the gate electrode 58 and the connecting electrode 60, and a drain terminal D is connected to a surface electrode 67 formed at the rear surface side of the silicon substrate 51. The four p-type ring-shaped diffusion regions 54a to 54d are provided in non-connected state to any of surface electrodes 64, 65, 66 or 67 and therefore in an electrically floating state. Similarly to the first embodiment in the state, the Zener diode group 61 in series connection of 60 pairs of the Zener diode pairs 61a is connected between the rain terminal D and the gate terminal G of the power MOSFET 50.

According to the above-mentioned embodiment, in similar manner to the second embodiment, if excessive voltage is applied between the drain terminal D and the source terminal S, the Zener diode group 61 is subjected to breakdown and voltage is applied to the gate terminal G, thereby the power MOSFET 50 is turned on and the overvoltage breakdown is prevented.

When normal power source voltage is applied between the drain terminal D and the source terminal S, the Zener diode group 61 is in the state of being not subjected to breakdown, and if the control voltage is not applied to the gate terminal G, the power MOSFET 50 holds the OFF-state. In this case, in the pn junction between the p-type diffusion regions 52, 53 and the silicon substrate 51, the depletion layer spreads to the silicon substrate 51 side due to the applied voltage, and since each of the ring-shaped diffusion regions 54a to 54d becomes the potential which the depletion layer attains, the potential becomes large stepwise in sequence from the ring-shaped diffusion region 54a at the inner circumferential side towards the ring-shaped diffusion region 54a at the outer circumferential side as described later.

On the other hand, in the polycrystalline silicon thin film layer 62 to constitute the Zener diode group 61 as above described, voltage applied to each element part 62b becomes large in sequence from the inner circumferential side towards the outer circumferential side. Then in the ring-shaped diffusion regions 54a to 54d arranged at a lower side of each element part 62b, since the potential becomes large stepwise in sequence, the potential difference applied between upper and lower surfaces of the silicon oxide film, that is, in the film thickness direction becomes less than the power source voltage. Consequently, margin is given to the strength for the dielectric breakdown of the silicon oxide film 59, and the dielectric breakdown strength is substantially improved. In other words, the withstand voltage of the Zener diode group 61 can be further raised.

The inventor has carried out simulation regarding potential applied to each of the ring-shaped diffusion regions 54a to 54d as above described, using the model shown in FIG. 11. That is, a silicon substrate Sub (n-type impurity atom concentration is $1.5 \times 10^{14}$ atm/cm$^3$) in FIG. 11 corresponds to the silicon substrate 51, and impurity atom concentration and geometric arrangement state are fitted respectively so that the p-type regions P0 to P4 correspond to the p-type diffusion region 53, the ring-shaped diffusion regions 54a to 54 respectively, and the n-type region N1 corresponds to the n-type diffusion region 56, and the electrode EQR corresponds to the surface electrode 66.

In the simulation, the potential distribution in each point on the main surface of the silicon substrate Sub is calculated from the spread state of the depletion layer when voltage of 415 V for example, is applied between the terminal D of the silicon substrate Sub and the terminal S of the p-type region P0. As a result, it is found that on the main surface of the silicon substrate Sub, the potential becomes large stepwise in sequence towards the p-type regions P0 to P4.

By optimizing intervals of the p-type regions P0 to P4, since the potential can be set to an amount close to the potential of each element part 62b of the polycrystalline silicon thin film layer 62, the potential difference applied in the film thickness direction of the silicon oxide film 59 of this embodiment can be decreased and the dielectric breakdown strength can be substantially improved. Consequently, in this setting, reversely, within range of the dielectric breakdown strength of the silicon oxide film 59, the breakdown voltage of the Zener diode group 61 can be further set to large value.

According to the third embodiment, since each element part 62b of the polycrystalline silicon thin film layer 62 to constitute the Zener diode group 61 is arranged as an upper side of the four ring-shaped diffusion regions 54a to 54d respectively, the potential difference applied in the film thickness direction of the silicon oxide film 59 interposed between the main surface 51b and the polycrystalline silicon thin film layer 62 can be greatly reduced, and the dielectric breakdown strength is substantially improved and the breakdown voltage Vz set by the Zener diode group 61 can be made further higher value.

In the third embodiment, although the 60 pairs of Zener diode pairs 61a are provided as the Zener diode group 61, the present invention is not limited to this, but the number of the Zener diode pairs 61a may be further increased or decreased.

Also in the third embodiment, although the description has been carried out in the case that one Zener diode group 61 is provided, the present invention is not limited to this, but, for example, a plurality of Zener diode group 61 may be arranged and formed in parallel throughout the whole circumference of the forming region of the ring-shaped diffusion regions 54a to 54d. In this case, since the current capacity of the Zener diode group 61 can be increased, utilization in the power MOSFET corresponding to the current capacity of large current becomes possible.

Figure 13:
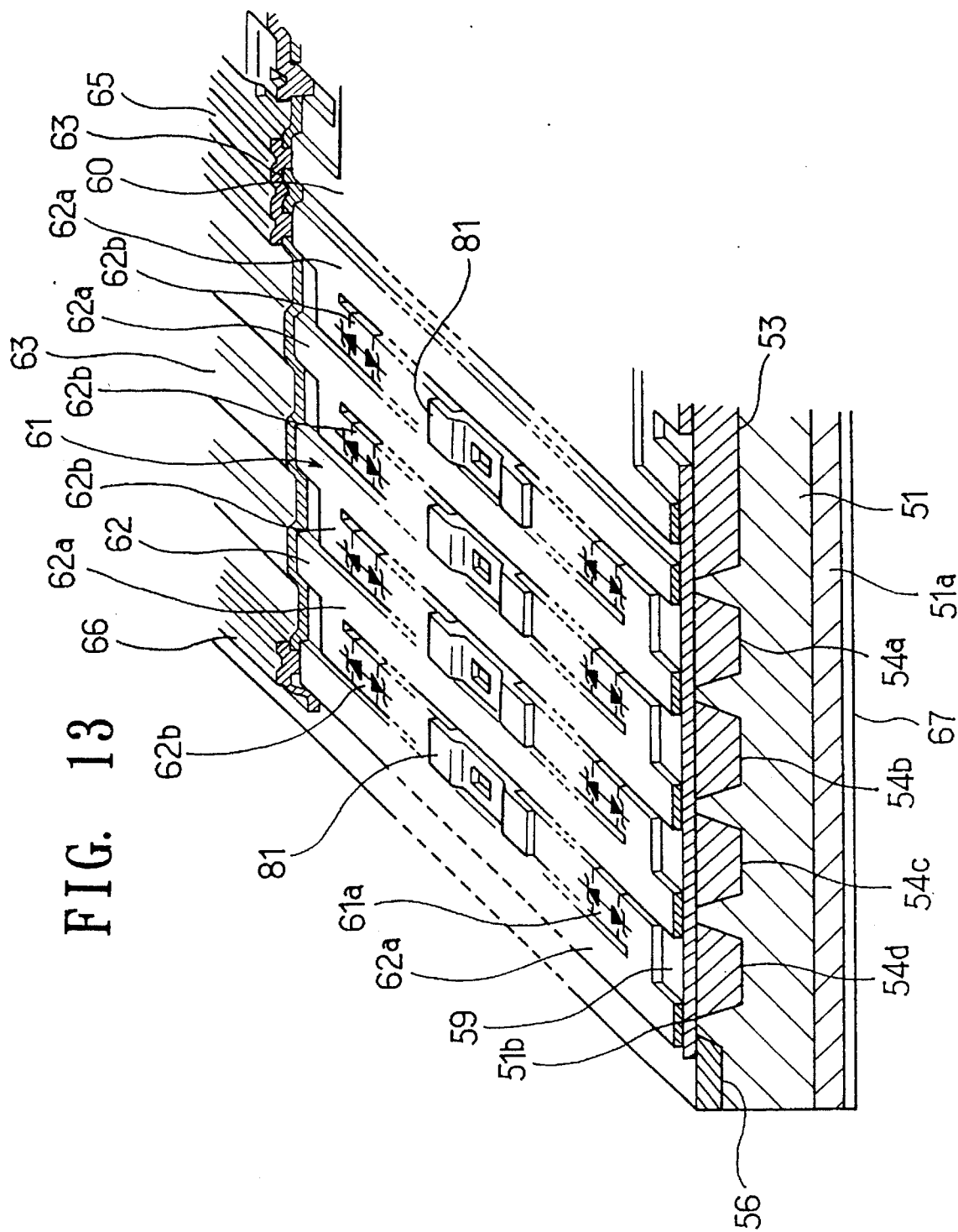
FIG. 13 is a diagram corresponding to FIG. 10 showing a fourth embodiment of the invention.
Figure 14:
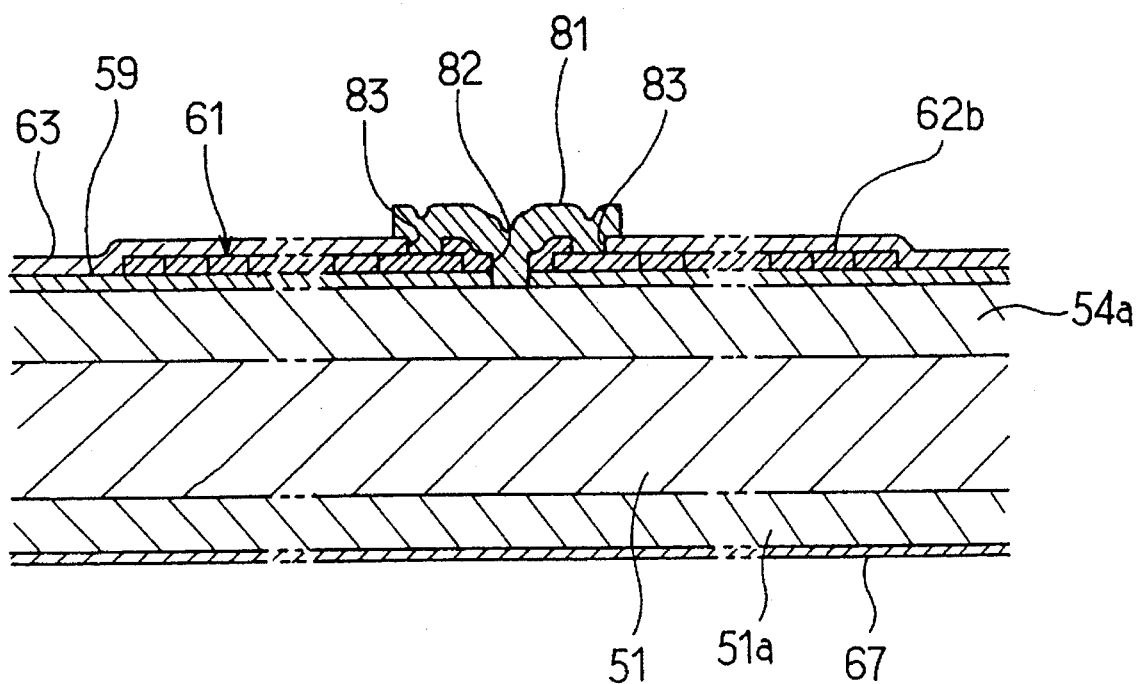
FIG. 14 is a longitudinal sectional side view along circumferential direction of element parts to constitute a Zener diode group.
Figure 15:
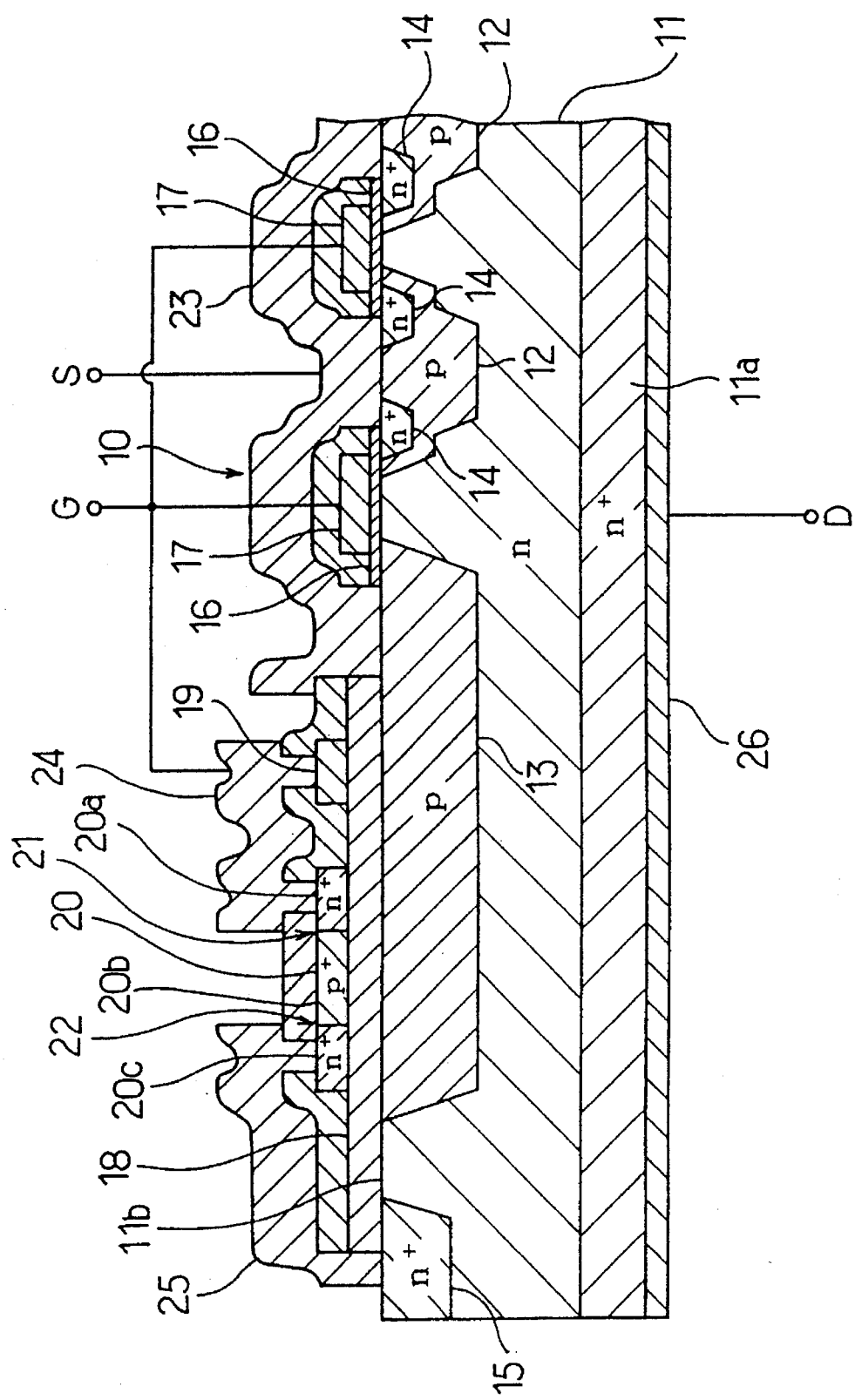
FIG. 15 is a modeled longitudinal sectional diagram showing an example in the prior art.

FIGS. 13 and 14 show a fourth embodiment of the present invention. Parts different from the third embodiment will be described as follows.

In FIG. 13, the difference from the third embodiment is in that at intermediate position of each element part 62b to form a Zener diode group 61, a conductive electrode 81 for connecting electrically each element part 62b to ring-shaped diffusion regions 54a to 54d is positioned as the lower part through the silicon oxide film 59.

FIG. 14 is a diagram showing one element part 62b in section along a circumferential direction. For example, at an intermediate position of the element part 62b, a contact hole 82 is formed so as to penetrate a BPSG protective film 63, a polycrystalline thin film layer 62 and a silicon oxide film 59, and the ring-shaped diffusion regions 54a to 54d formed within the silicon substrate 51 are exposed. Also at the polycrystalline thin film layer 62 positioned at both sides of the contact hole 82 is formed a contact hole 83 which opens and exposes the BPSG protective film 63. The conductive electrode 81 is formed by aluminium evaporation and photo lithography so as to cover both the contact holes 82 and 83.

Thereby since each of the ring-shaped diffusion regions 54a to 54d becomes conductive state to the intermediate position of the element part 62b to constitute the Zener diode group 61 respectively through the conductive electrode 81, it is held to the same potential as that of the Zener diode pair 61a in that part.

Consequently, according to the fourth embodiment, the voltage shared by the Zener diode pair 61a in the part of installing the conductive electrode 81 is set equal to the voltage value obtained by simulation, thereby the potential difference applied in the film thickness direction of the silicon oxide film 59 can be suppressed to a prescribed value or less and the reliability of the silicon oxide film 59 can be improved. Also the shared voltage is properly set, thereby reverse direction withstand voltage of the pn junction between the p-type diffusion region 53 and the silicon substrate, hence reverse direction withstand voltage between the drain D and the gate G can be adjusted and set to the optimum value.

In each of embodiments as above described, although the description has been carried out regarding the case that the n-channel power MOSFET 31, 50 or 101 is used as the first semiconductor element, the present invention is not limited to this, but, for example, application to the p-channel power MOSFET is possible, or application not only to the power MOSFET but also to the semiconductor element such as a bipolar transistor or IGBT (insulation gate type bipolar transistor) becomes possible.

Further in each of embodiments as above described, although the description has been carried out regarding the case that the Zener diodes 43, 44 or the Zener diode groups 61, 115 are used as the second semiconductor element, the present invention is not limited to this, but, for example, application to devices having a resistor as the second semiconductor element becomes possible.

What is claimed is:

1. A power semiconductor device with protective element, comprising:
   a semiconductor substrate of a first conductivity type, said semiconductor substrate having a first region and a second region which shares a border with said first region;
   an impurity diffusion region of a second conductivity type formed at a main surface of said first region of said semiconductor substrate, a power element as a main power part of said power semiconductor device including said impurity diffusion region;
   a first electrode contacting electrically with said semiconductor substrate;
   a second electrode contacting electrically with said impurity diffusion region, said first and second electrodes being supplied with a potential reversely biasing a PN junction between said semiconductor substrate and said impurity diffusion region;
   an insulation film covering a main surface of said second region of said semiconductor substrate;
   protective means for protection of said power element including semiconductor films arranged on said insulation film on a side of said insulation film opposite said second region, each of said semiconductor films extending along said border;
   means for supplying an outermost one of said semiconductor films remote from said impurity diffusion region with a potential equivalent to that applied to said first electrode; and
   means for connecting said respective semiconductor films to have a potential distribution approaching the potential applied to said second electrode while advancing from the outermost film towards an innermost one of said semiconductor films proximate to said impurity diffusion region.

2. A power semiconductor device as set forth in claim 1, wherein each of said semiconductor films is disposed in parallel to the end of said impurity diffusion region and constituting a pn junction diode, and a potential of each semiconductor film is shared by a potential between a potential applied to said first electrode and a potential applied to said second electrode.

3. A power semiconductor device as set forth in claim 2, wherein the potential of each semiconductor film is matched with a potential corresponding to the position of a depletion layer extending from said PN junction towards the semiconductor substrate side.

4. A power semiconductor device as set forth in claim 3, further comprising diffusion layers of the second conductivity type in an electrically floating state with said impurity diffusion region located at the main surface of said second region of said semiconductor substrate, each of said diffusion layers being formed independently along said border.

5. A power semiconductor device as set forth in claim 4, wherein each of said diffusion layers is located at a corresponding portion beneath said respective semiconductor films.

6. A power semiconductor device as set forth in claim 2, further comprising diffusion layers of the second conductivity type in an electrically floating state with said impurity diffusion region located at the main surface of said second region of said semiconductor substrate, each of said diffusion layers being formed independently and along said border.

7. A power semiconductor device as set forth in claim 6, wherein each of said diffusion layers is located at a corresponding portion beneath said respective semiconductor films.

8. A power semiconductor device as set forth in claim 7, wherein each of the diffusion layers of the second conductivity type is provided with a potential of the corresponding semiconductor film.

9. A power semiconductor device as set forth in claim 1, further comprising a field plate part disposed over a periphery of the impurity diffusion, said second region being located at an out side of said field plate part.

10. A power semiconductor device as set forth in claim 1, wherein a potential distributed throughout said semiconductor films is matched with a potential distribution of a depletion layer extending from said PN junction towards the semiconductor substrate side.

11. A power semiconductor device as set forth in claim 10, further comprising diffusion layers of the second conductivity type in an electrically floating state with said impurity diffusion region located at the main surface of said second region of said semiconductor substrate, each of said diffusion layers being formed independently along said border.

12. A power semiconductor device as set forth in claim 1, further comprising a diffusion layer of the second conductivity type in an electrically floating state with said impurity diffusion region located at the main surface of said second region of said semiconductor substrate and beneath said semiconductor films.

13. A power semiconductor device comprising:
   a semiconductor substrate of a first conductivity type;
   a power semiconductor element region including at least one unit cell having a drain region of a first conductivity type in said semiconductor substrate, an impurity diffusion region of a second conductivity type formed at a main surface of the semiconductor substrate, a source region of the first conductivity type formed at a main surface of the impurity diffusion region, a common gate electrode, a common source electrode contacting both said source region and said impurity diffusion region, and a common drain electrode contacting said semiconductor substrate;

a protection semiconductor element region arranged at an out side of said power semiconductor element region;

an insulation film covering a main surface of said semiconductor substrate at said protection semiconductor element region;

a plurality of semiconductor films on said insulation film on a side of said insulation film opposite said semiconductor substrate, each of said semiconductor films being independent and positioned to surround said power semiconductor element region respectively, an outermost film thereof being connected to the main surface of said semiconductor substrate to apply a drain potential and an innermost film thereof being connected to said common gate electrode, said semiconductor films being connected in series; and a protection semiconductor element having a plurality of pn junction diodes, each of said diodes being formed in one of said semiconductor films.

14. A power semiconductor device according to claim 13, wherein each of said semiconductor films is arranged so that a potential distribution in said protection semiconductor element is matched with a potential distribution of a depletion layer extending outwardly from a PN junction between said impurity diffusion region and said semiconductor substrate.

15. A power semiconductor device according to claim 13, further comprising ring-shaped diffusion regions of the second conductivity type formed to surround said power semiconductor element region, each of said ring-shaped diffusion regions being disposed below said respective semiconductor films.

16. A power semiconductor device according to claim 15, wherein each of said ring-shaped diffusion regions constitutes a guard ring.

17. A power semiconductor device according to claim 13, further comprising a field plate region between said power semiconductor element region and said semiconductor element region.

* * * * *